United States Patent
Chen et al.

(10) Patent No.: US 12,316,320 B2
(45) Date of Patent: May 27, 2025

(54) DRIVING CIRCUIT HAVING A SWITCH MODULE TO BE CAPABLE OF TURNING OFF A CONDUCTIVE PATH

(71) Applicant: RichWave Technology Corp., Taipei (TW)

(72) Inventors: Chih-Sheng Chen, Taipei (TW); Tien-Yun Peng, Taipei (TW); Hsien-Huang Tsai, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/551,127

(22) Filed: Dec. 14, 2021

(65) Prior Publication Data

US 2023/0058738 A1  Feb. 23, 2023

(30) Foreign Application Priority Data

Aug. 18, 2021 (TW) ................... 110130519

(51) Int. Cl.
*H03K 3/01* (2006.01)
(52) U.S. Cl.
CPC ....................... *H03K 3/01* (2013.01)
(58) Field of Classification Search
CPC ....................................... H03K 3/01
See application file for complete search history.

(56) References Cited

U.S. PATENT DOCUMENTS

| | | | | |
|---|---|---|---|---|
| 6,130,813 | A * | 10/2000 | Kates | H02J 7/0031 361/93.1 |
| 6,353,346 | B1 * | 3/2002 | Chan | H03K 19/00361 327/170 |
| 6,388,468 | B1 * | 5/2002 | Li | H03K 17/7955 327/333 |
| 7,394,172 | B2 * | 7/2008 | Anderson | H02J 9/061 307/130 |
| 8,427,196 | B2 * | 4/2013 | Confalonieri | H03K 17/162 326/26 |
| 8,829,945 | B2 | 9/2014 | Santos | |
| 9,692,374 | B2 * | 6/2017 | Saeki | H03F 3/45475 |

(Continued)

FOREIGN PATENT DOCUMENTS

| CN | 101185162 A | * | 5/2008 | ........ H01L 27/0207 |
|---|---|---|---|---|
| CN | 101946565 A | * | 1/2011 | ........ H05B 41/042 |

(Continued)

*Primary Examiner* — Lincoln D Donovan
*Assistant Examiner* — James G Yeaman
(74) *Attorney, Agent, or Firm* — Winston Hsu (57) ABSTRACT

A driving circuit includes a first reference terminal, a second reference terminal, at least one input terminal, an output terminal, a first transistor, a second transistor, a switch module, and at least one control signal terminal. The at least one input terminal receives at least one input signal. The output terminal outputs an output signal in response to the at least one input signal. The first transistor and the second transistor respectively include control terminals coupled to the at least one input terminal. The switch module includes at least one control terminal coupled to the at least one control signal terminal to receive at least one control signal. The at least one input signal has a transition period. The switch module can be turned off according to the at least one control signal.

17 Claims, 7 Drawing Sheets

(56) References Cited

U.S. PATENT DOCUMENTS

| | | | |
|---|---|---|---|
| 10,454,363 B1* | 10/2019 | Chung | H02M 3/33592 |
| 2004/0242171 A1 | 12/2004 | Hosokawa | |
| 2006/0256591 A1* | 11/2006 | Utsunomiya | H02M 3/156 |
| | | | 363/59 |
| 2010/0141319 A1* | 6/2010 | Marutani | H03L 7/00 |
| | | | 327/170 |
| 2011/0102037 A1* | 5/2011 | Cheng | H03K 17/223 |
| | | | 327/198 |
| 2011/0241746 A1* | 10/2011 | Fu | H03H 11/265 |
| | | | 327/276 |
| 2014/0140114 A1* | 5/2014 | Shoji | H02M 7/53871 |
| | | | 363/89 |
| 2014/0226402 A1* | 8/2014 | Duzly | G11C 16/26 |
| | | | 365/185.11 |
| 2014/0300593 A1* | 10/2014 | Jang | G06F 1/24 |
| | | | 327/143 |
| 2016/0079979 A1* | 3/2016 | Kinzer | H01L 29/1033 |
| | | | 327/333 |
| 2016/0294373 A1* | 10/2016 | Grubelich | H03K 3/356017 |
| 2018/0090482 A1* | 3/2018 | Lee | H01L 27/0722 |
| 2018/0342210 A1* | 11/2018 | Choi | G09G 3/3688 |
| 2019/0363706 A1 | 11/2019 | Shinomiya | |
| 2020/0074908 A1* | 3/2020 | Kang | G09G 3/3233 |
| 2021/0013802 A1* | 1/2021 | Shen | H02M 3/07 |

FOREIGN PATENT DOCUMENTS

| | | | | |
|---|---|---|---|---|
| CN | 111200405 A | * | 5/2020 | H03F 1/223 |
| CN | 111294700 A | * | 6/2020 | H04R 3/00 |
| CN | 111833888 A | * | 10/2020 | G10L 15/02 |
| CN | 112331248 A | * | 2/2021 | |
| CN | 108023478 B | * | 3/2021 | H02M 3/156 |
| DE | 112013002933 T5 | * | 3/2015 | H05B 33/0815 |
| GB | 2043381 A | * | 10/1980 | B61L 3/246 |
| JP | 2005051693 A | * | 2/2005 | |
| JP | 4656263 B1 | * | 3/2011 | H04L 25/0276 |
| JP | 2013183193 A | * | 9/2013 | |
| KR | 20150053503 A | * | 5/2015 | |
| WO | WO-9900764 A2 | * | 1/1999 | G06K 15/1214 |
| WO | WO-2010150183 A1 | * | 12/2010 | H05B 33/0815 |
| WO | WO-2018016260 A1 | * | 1/2018 | G06F 1/24 |
| WO | WO-2020019374 A1 | * | 1/2020 | G09G 3/20 |

* cited by examiner

DRIVING CIRCUIT HAVING A SWITCH MODULE TO BE CAPABLE OF TURNING OFF A CONDUCTIVE PATH

TECHNICAL FIELD

The application is related to a driving circuit, and more particularly, a driving circuit having a switch module capable of turning off a conductive path.

BACKGROUND

In the field of switch control, a switch driver can be used to generate a control signal, and the control signal can be used to turn on and turn off a switch.

The switch driver can be coupled to a positive voltage terminal and a negative voltage terminal to respectively receive a positive voltage and a negative voltage. For example, the negative voltage can be provided by a charge pump, where the charge pump can include a capacitor to store negative charges as a source of the negative voltage.

However, if the switch in the switch driver is not properly controlled, a conductive path between the positive voltage terminal and the negative voltage terminal may be present during the switching period of the signal, which may cause the negative charges stored in the capacitor of the charge pump to flow away and may pull up the negative voltage or pull down the positive voltage. Therefore, the negative voltage may not be negative enough or the positive voltage may not be positive enough.

SUMMARY

An embodiment provides a driving circuit comprising a first reference terminal, a second reference terminal, at least one input terminal, an output terminal, a first transistor, a second transistor, a switch module and at least one control signal terminal. The first reference terminal is configured to receive a first reference voltage. The second reference terminal is configured to receive a second reference voltage. The at least one input terminal is configured to receive at least one input signal. The output terminal is configured to output an output signal in response to the at least one input signal, where the output signal and the at least one input signal are at different logic levels. The first transistor is coupled between the first reference terminal and the second reference terminal, and comprises a control terminal coupled to the at least one input terminal. The second transistor is coupled between the first transistor and the second reference terminal, and comprises a control terminal coupled to the at least one input terminal. The switch module is coupled between the first reference terminal and the first transistor, between the first transistor and the second transistor and/or between the second transistor and the second reference terminal, and the switch module comprises at least one control terminal. The at least one control signal terminal is coupled to the at least one control terminal of the switch module, and configured to receive at least one control signal. The level of the at least one input signal is switched during a transition period. The switch module is turned off according to the at least one control signal during a turn-off period. The duration of an overlap period of the transition period and the turn-off period is equal to 70% to 100% of the duration of the transition period. The duration of the turn-off period of the switch module is equal to 70% to 120% of the duration of the transition period.

Another embodiment provides a driving circuit comprising a first reference terminal, a second reference terminal, at least one input terminal, an output terminal, a first transistor, a second transistor, a switch module and at least one control signal terminal. The first reference terminal is configured to receive a first reference voltage. The second reference terminal is configured to receive a second reference voltage. The at least one input terminal is configured to receive at least one input signal. The output terminal is configured to output an output signal in response to the at least one input signal, where the output signal and the at least one input signal are at different logic levels. The first transistor is coupled between the first reference terminal and the second reference terminal, and comprises a control terminal coupled to the at least one input terminal. The second transistor is coupled between the first transistor and the second reference terminal, and comprises a control terminal coupled to the at least one input terminal. The switch module is coupled between the first reference terminal and the first transistor, between the first transistor and the second transistor and/or between the second transistor and the second reference terminal, and the switch module comprises at least one control terminal. The at least one control signal terminal is coupled to the at least one control terminal of the switch module, and is configured to receive at least one control signal. The level of the at least one input signal is switched during a transition period, the switch module is turned off according to the at least one control signal during a turn-off period, and the turn-off period of the switch module and the transition period of the at least one input signal at least partially overlap. At least one of the first reference voltage and the second reference voltage is provided by a charge pump, and during the transition period, at least one of the first reference voltage and the second reference voltage does not vary larger than 10%.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
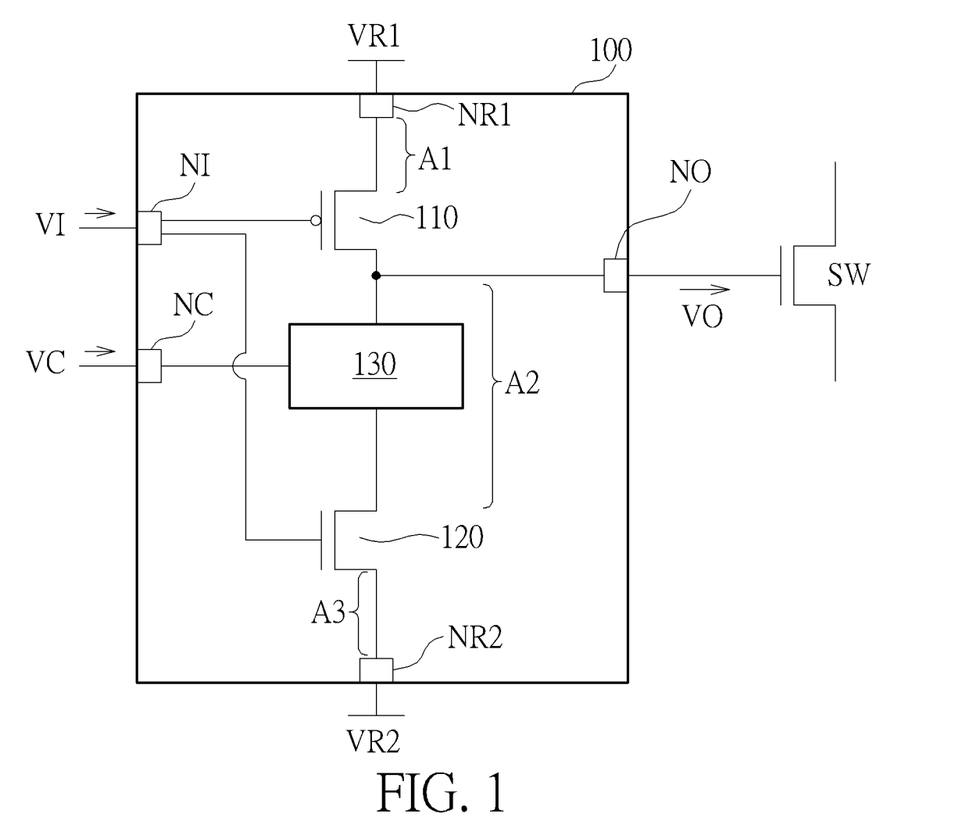
FIG. 1 illustrates a driving circuit coupled to a switch according to an embodiment.
Figure 2:
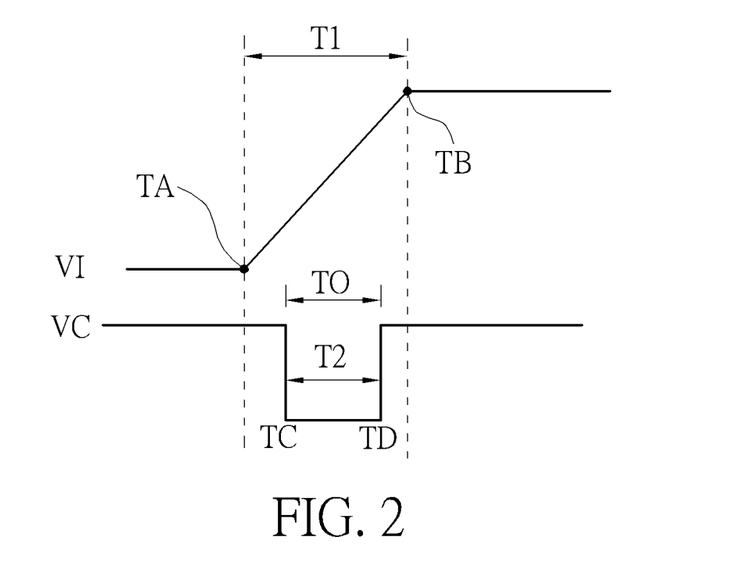
FIG. 2 illustrates waveforms of the at least one input signal and the at least one control signal of FIG. 1.

FIG. 1 illustrates a driving circuit 100 coupled to a switch SW according to an embodiment. FIG. 2 illustrates waveforms of the at least one input signal VI and the at least one control signal VC of FIG. 1. As shown in FIG. 1, the driving circuit 100 can include a first reference terminal NR1, a second reference terminal NR2, at least one input terminal NI, an output terminal NO, a first transistor 110, a second transistor 120, a switch module 130 and at least one control signal terminal NC.

The first reference terminal NR1 is used to receive a first reference voltage VR1. The second reference terminal NR2 is used to receive a second reference voltage VR2. The at least one input terminal NI is used to receive at least one input signal VI. The output terminal NO is used to output an output signal VO in response to the at least one input signal VI, where the output signal VO and the at least one input signal VI are at different logic levels. For example, the output signal VO can be used to drive and control the switch SW. According to embodiments, the first reference voltage VR1 is a positive voltage, and the second reference voltage VR2 is a negative voltage.

The first transistor 110 is coupled between the first reference terminal NR1 and the second reference terminal NR2 and includes a control terminal coupled to the at least one input terminal NI. The second transistor 120 is coupled between the first transistor 110 and the second reference terminal NR2 and includes a control terminal coupled to the at least one input terminal NI.

The switch module 130 can be coupled between the first reference terminal NR1 and the first transistor 110 (e.g., in the range A1), between the first transistor 110 and the second transistor 120 (e.g., in the range A2) and/or between the second transistor 120 and the second reference terminal NR2 (e.g., in the range A3). The switch module 130 can include at least one control terminal coupled to the at least one control signal terminal NC for receiving at least one control signal VC. In FIG. 1, the switch module 130 is coupled between the first transistor 110 and the second transistor 120 (e.g., in the range A2). However, FIG. 1 is an example, and embodiments are not limited thereto.

In FIG. 1, the level(s) of the at least one input signal VI can be switched, for example, from a high level to a low level, or from a low level to a high level. For example, the period during which the level(s) of the at least one input signal VI is switched may be referred as a transition period T1. According to an embodiment, during the transition period T1 of the at least one input signal VI, the switch module 130 can be turned off according to the at least one control signal VC, and the period during which the switch module 130 is turned off can be denoted as a turn-off period T2. For example, the duration of the turn-off period T2 of the switch module 130 can be equal to 70% to 120% of the duration of the transition period T1 of the at least one input signal VI. Further, according to an embodiment, the turn-off period T2 of the switch module 130 and the transition period T1 of the at least one input signal VI can partially overlap, where the overlap period can be denoted as TO. For example, the duration of the overlap period TO can be equal to 70% to 100% of the duration of the transition period T1 of the input signal(s) VI.

In FIG. 2, the input signal VI can be switched from a low level to a high level as an example. The transition period T1 of the input signal VI can last from a point TA to a point TB. For example, when the control signal VC is at a low level, the switch module 130 can be in a turned off state, and such a turn-off period T2 of the switch module 130 can last from a point TC to a point TD. According to an embodiment, the point TC can come before, after or simultaneously with the point TA, and/or the point TD can come before, after or simultaneously with the point TB. Therefore, the duration of the turn-off period T2 can be shorter than, longer than or equal to the duration of the transition period T1. Thus, as described above, the relationship between the duration of the transition period T1 and that of the turn-off period T2 can be expressed as 70%≤(T2/T1)≤120%.

Further, in case of T2=T1*120%, the turn-off period T2 of the switch module 130 is longer than the transition period T1 of the input signal VI, where the point TC can precede the point TA by T1*10%, the point TB can precede the point TD by T1*10%, and the overlap period TO can be equal to the transition period T1.

As shown in FIG. 2, the turn-off period T2 can be shorter than the transition period T1. The point TA can precede the point TC, and the point TD can precede the point TB. Therefore, the overlap period TO of the turn-off period T2 and the transition period T1 can be equal to the turn-off period T2. However, FIG. 2 is an example, and embodiments are not limited thereto. As above, the relationship between the duration of the overlap period TO and that of the transition period T1 can be expressed as 70%≤(TO/T1)≤100%.

FIG. 2 is an example instead of a limit of the scope of the embodiments. In another embodiment, the turn-off period T2 of the switch module 130 may be discontinuous. For example, the turn-off period T2 can include two separated turn-off periods.

According to an embodiment, according to the at least one input signal VI, when one of the first transistor T1 and the second transistor T2 is on, the other one is off. For example, when the input signal VI is at a low level, the first transistor 110 can be on, and the second transistor 120 can be off. When the input signal VI is switched from a low level to a high level (i.e., during the transition period T1), the first transistor 110 is switched from an "on" state to an "off" state, and the second transistor 120 is switched from "off" state to "on" state. During the transition period T1, the first transistor 110 and the second transistor 120 may be concurrently ON, resulting in an undesired conductive path. The present of the conductive path may cause a voltage drop in the positive first reference voltage VR1 and/or a voltage raise in the negative second reference voltage VR2. As a result, the positive first reference voltage VR1 may not be positive enough, and/or the negative second reference voltage VR2 may not be negative enough. As shown in FIG. 1 and FIG. 2, according to the control signal VC, the switch module 130 can be turned off during the turn-off period T2, so as to cut off the conductive path formed when the first transistor 110 and the second transistor 120 are both on as abovementioned, such that the positive first reference voltage VR1 and/or the negative second reference voltage VR2 are maintained at proper levels. Therefore, the performance of the driving circuit is improved.

According to an embodiment, as shown in FIG. 1, for example, the first transistor 110 can be P-type, and the second transistor 120 can be N-type.

According to an embodiment, the switch module 130 can include at least one transistor, which may be a P-type transistor and/or an N-type transistor. The transistor of the switch module 130 can be larger than, equal to or smaller than each of the first transistor 110 and the second transistor 120. For example, the transistor of the switch module 130 can be selected to be smaller than the first transistor 110 and the second transistor 120 to achieve a higher switching speed. In another case, the transistor of the switch module 130 can be selected to be larger than the first transistor 110 and the second transistor 120 to achieve a faster charging speed from the driving circuit 110 to the switch SW.

According to an embodiment, the transition period T2 of the at least one input signal VI can be approximately 1~100 microsecond (μs), and the turn-off period T2 of the switch module 130 can be approximately 0.7 to 1.2 microseconds.

Figure 3:
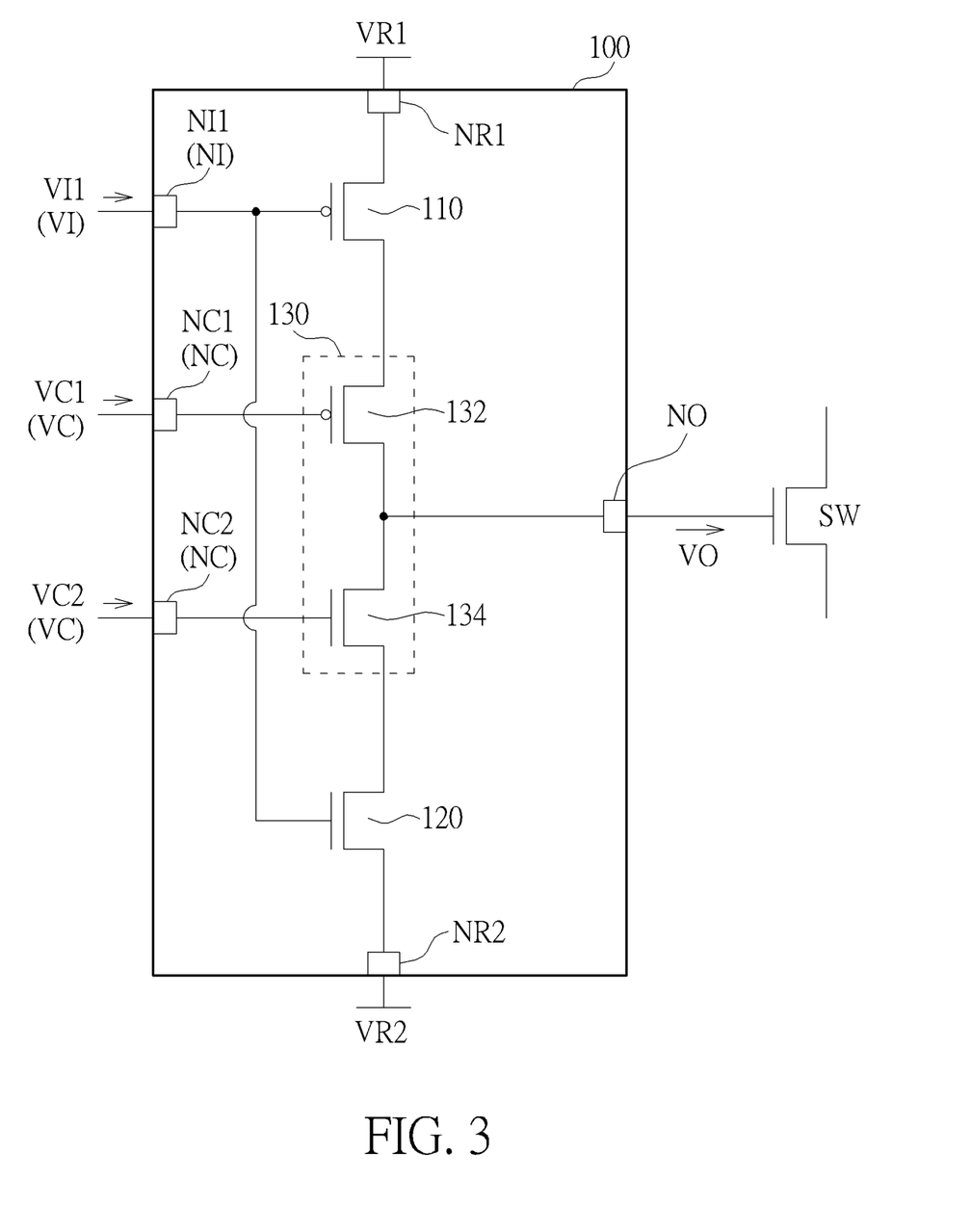
FIG. 3 illustrates the driving circuit of FIG. 1 coupled to the switch according to an embodiment.
Figure 4:
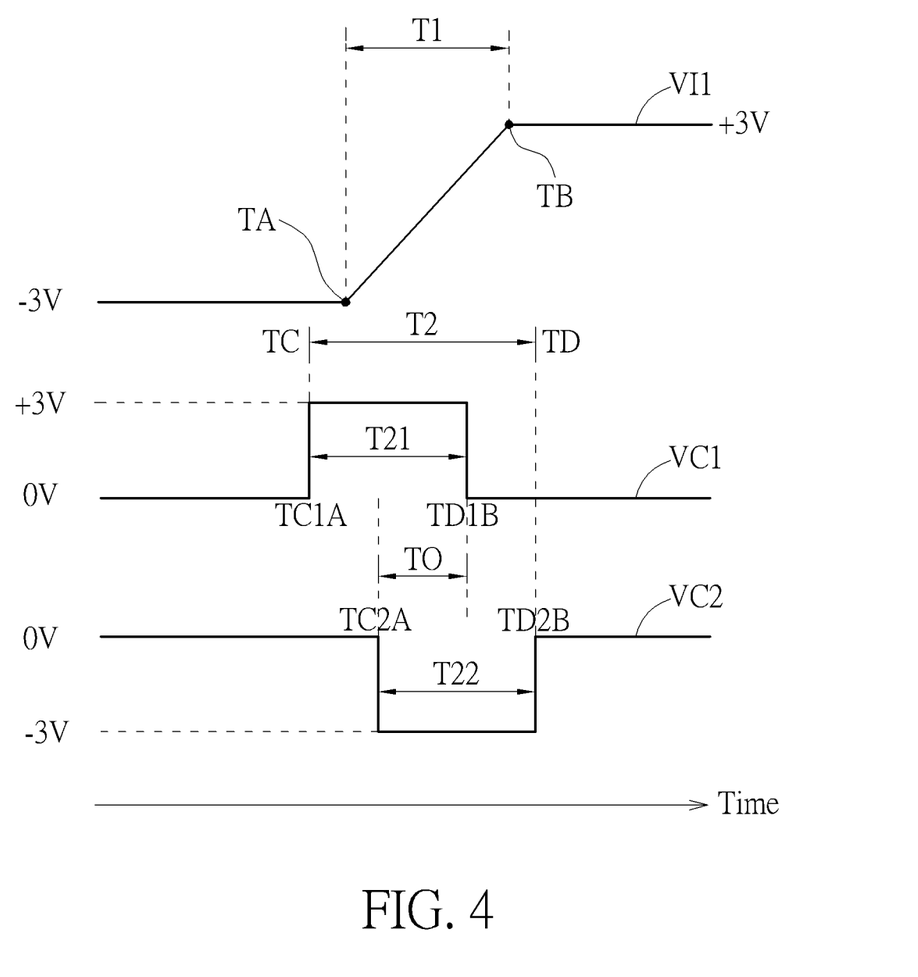
FIG. 4 illustrates waveforms of the signals of FIG. 3.

FIG. 3 illustrates the driving circuit 100 of FIG. 1 coupled to the switch SW according to an embodiment. FIG. 4 illustrates waveforms of the signals of FIG. 3. In FIG. 3, the first transistor 110 and the second transistor 120 are controlled by the same input signal VI1.

As shown in FIG. 3, the switch module 130 can include a first switch 132 and a second switch 134. The at least one control signal terminal NC can include first and second control signal terminals NC1 and NC2 respectively used to receive first and second control signals VC1 and VC2. The first switch 132 can be coupled between the first transistor 110 and the second transistor 120, and include a first control terminal coupled to the first control signal terminal NC1 to receive the first control signal VC1. The second switch 134 can be coupled between the first switch 132 and the second transistor 120, and include a second control terminal coupled to the second control signal terminal NC2 to receive the second control signal VC2. According to embodiments, the size of the first switch 132 can be larger than, equal to or smaller than the size of the first transistor 110, and the size of the second switch 134 can be larger than, equal to or smaller than the size of the second transistor 120.

According to an embodiment, the first control signal VC1 can turn off the first switch 132 during a first turn-off period T21, and the second control signal VC2 can turn off the second switch 134 during a second turn-off period T22. The first turn-off period T21 and the second turn-off period T22 can overlap. Alternatively, the first turn-off period T21 and the second turn-off period T22 may not overlay, such as one succeeding another immediately without overlapping. Hence, the turn-off period T2 can be determined by the first turn-off period T21 and the second turn-off period T22. For example, the start point TC of the turn-off period T2 can be the earlier one (e.g., the point TC1A shown in FIG. 4) of the start point TC1A of the first turn-off period T21 and the start point TC2A of the second turn-off period T22. The end point TD of the turn-off period T2 can be the latter one (e.g., the point TD2B shown in FIG. 4) of the end point TD1B of the first turn-off period T21 and the end point TD2B of the second turn-off period T22.

According to an embodiment, the first turn-off period T21 and the second turn-off period T22 can partially overlap, completely overlap or not overlap. The first turn-off period T21 and the second turn-off period T22 partially overlap in FIG. 4. However, this is an example, and embodiments are not limited thereto. Particularly, when the first turn-off period T21 and the second turn-off period T22 do not overlap, an interval may be present between the first turn-off period T21 and the second turn-off period T22, and during this interval, the first transistor 110 and the second transistor 120 may be on at the same time, causing a current leakage through the first transistor 110 and the second transistor 120. In view of this, the interval between the first turn-off period T21 and the second turn-off period T22 can be very short, so that the unwanted current leakage caused during the interval can be negligible.

According to an embodiment, the first transistor 110 and the first switch 132 can be formed by a first type of transistor, and the second transistor 120 and the second switch 134 can be formed by a second type of transistor. For example, one of the first type and second type can be P-type, and the other one of the first type and second type can be N-type. For example, as shown in FIG. 3, the first transistor 110 and the first switch 132 can be P-type transistors, and the second switch 134 and second transistor 120 can be N-type transistors. In this condition, the first switch 132 can be maintained off in the first turn-off period T21 when the first control signal VC1 is at a high level (e.g., +3V), and second switch 134 can be maintained off in the second turn-off period T22 when the second control signal VC2 is at a low level (e.g., −3V).

For example, as shown in FIG. 4, during the transition period T1, the first input signal VI1 can be switched between −3V and +3V. For example, when the first input signal VI1 is at −3V, the first transistor 110 can be on, and the second transistor 120 can be off, so the output signal VO can be equal to the first reference voltage VR1 which is at a high level (e.g., +3V). When the first input signal VI1 is at +3V, the first transistor 110 can be off, and the second transistor 120 can be on, so the output signal VO can be equal to the second reference voltage VR2 which is at a low level (e.g., −3V).

Corresponding to the transition period T1, the first control signal VC1 can be switched from a voltage VSS (e.g., 0V) to +3V, and t then to the voltage VSS to form a pulsed waveform. Similarly, the second control signal VC2 can be switched from the voltage VSS (e.g., 0V) to −3V, and then to the voltage VSS to form a pulsed waveform. In the disclosure, the abovementioned voltage VSS can be between the first reference voltage VR1 and the second reference voltage VR2. For example, the first switch 132 can be on when the first control signal VC1 is at 0V, and the first switch 132 can be off when the first control signal VC1 is at +3V. The second switch 134 can be on when the second control signal VC2 is at 0V, and the second switch 134 can be off when the second control signal VC2 is at −3V.

Figure 5:
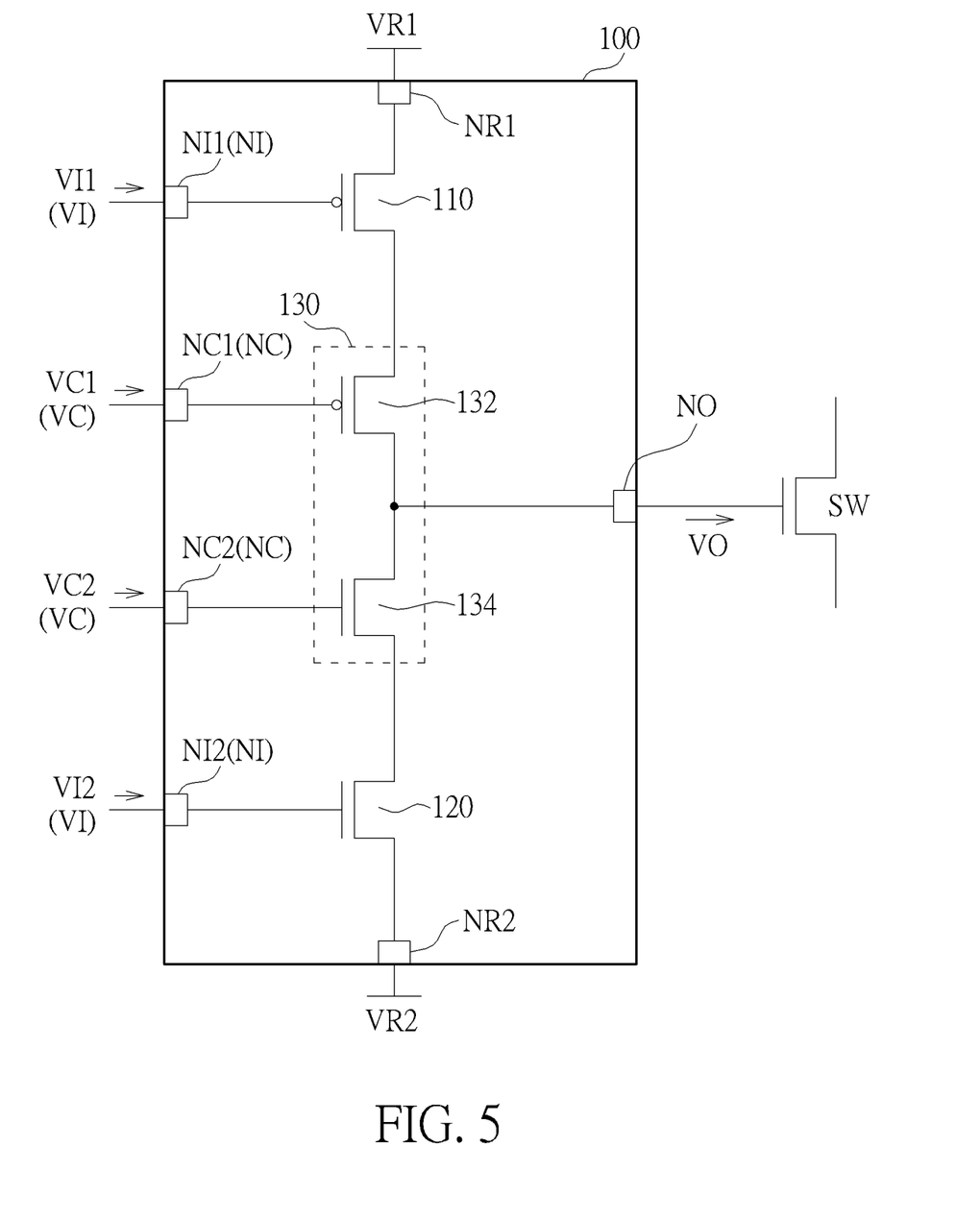
FIG. 5 illustrates the driving circuit of FIG. 1 coupled to the switch according to another embodiment.
Figure 6:
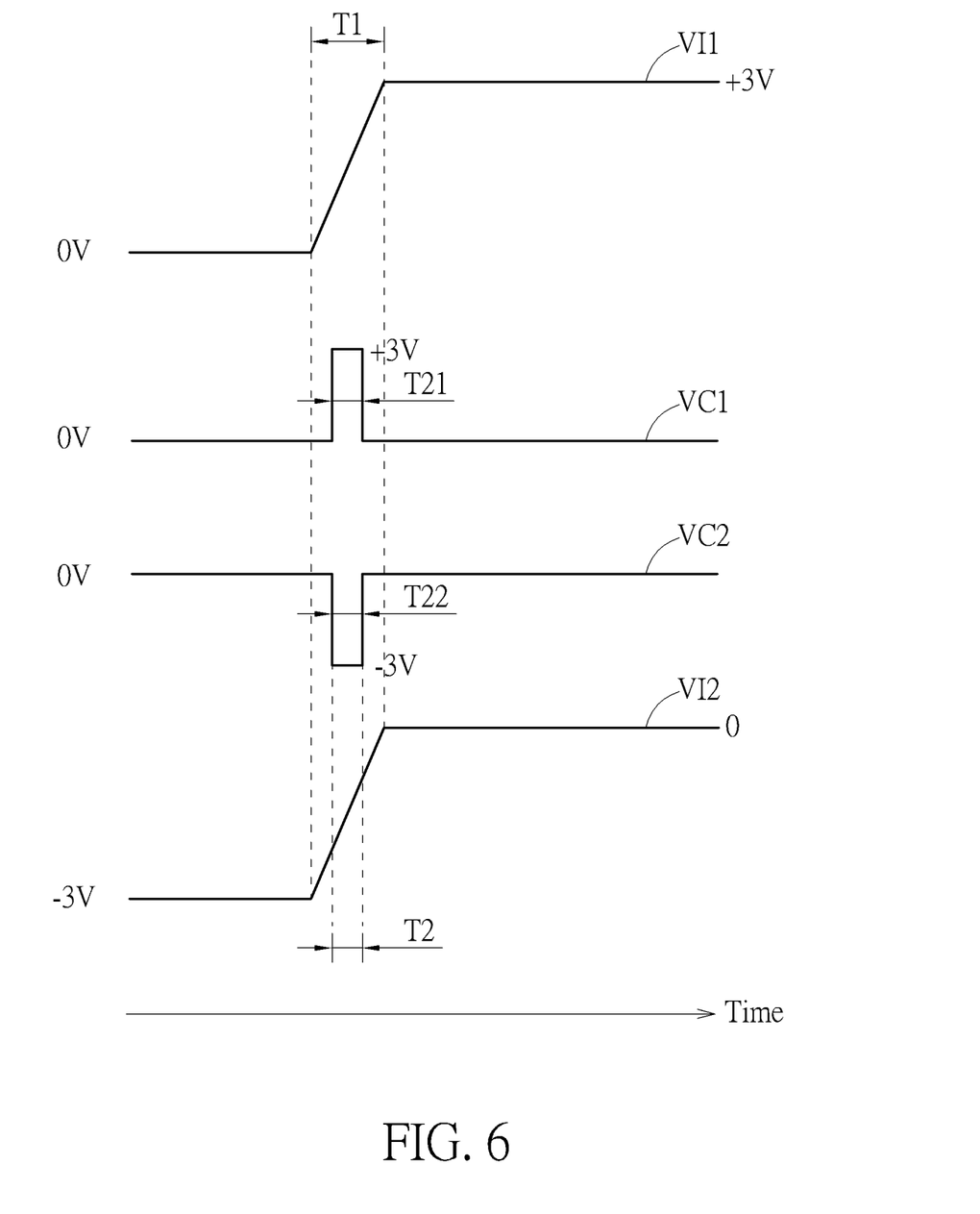
FIG. 6 illustrates waveforms of the signals of FIG. 5.

FIG. 5 illustrates the driving circuit 100 of FIG. 1 coupled to the switch SW according to another embodiment. FIG. 6 illustrates waveforms of the signals of FIG. 5. FIG. 5 can be similar to FIG. 3. However, as shown in FIG. 5, the first transistor 110 and the second transistor 120 can be separately controlled. In FIG. 5, the at least one input signal VI can include the first input signal VI1 and the second input signal VI2. The at least one input terminal NI can include the first input terminal NI1 and the second input terminal NI2. The first input terminal NI1 can receive the first input signal VI1, and the second input terminal NI2 can receive the second input signal VI2. The first input signal VI1 can be used to control the first transistor 110, and the second input signal VI2 can be used to control the second transistor 120.

During the transition period T1, the first input signal VI1 can be switched from a first level to a second level, and the second input signal VI2 can be switched from a third level to a fourth level. According to an embodiment, the first level can be lower than the second level, and the third level can be lower than the fourth level. For example, as shown in FIG. 6, the first level can be 0V, the second level can be +3V, the third level can be −3V and the fourth level can be 0V. For example, when the first input signal VI1 is at the first level, and the second input signal VI2 is at the third level, the first transistor 110 can be on, the second transistor 120 can be off, and the output signal VO can be at a high level. When the first input signal VI1 is at the second level, and the second input signal VI2 is at the fourth level, the first transistor 110 can be off, and the second transistor 120 can be d on, so output signal VO can be at the low level. In FIG. 5, with the first transistor 110 and the second transistor 120 respectively controlled by the first input signal VI1 and the second input signal VI2, the first transistor 110 and the second transistor 120 can be prevented from breakdown caused by an excessive cross voltage.

As shown in FIG. 6, for example, the first input signal VI1 can be switched from 0V to +3V, and the second input signal VI2 can be switched from −3V to 0V. Corresponding to the transition period T1 of the input signals VI1 and VI2, the first control signal VC1 can be switched from 0V to +3V and then to 0V, and the second control signal VC2 can be switched from 0V to −3V and then to 0V. In FIG. 6, the first turn-off period T21 and the second turn-off period T22 may fully overlap. However, this is an example, and embodiments are not limited thereto.

Figure 7:
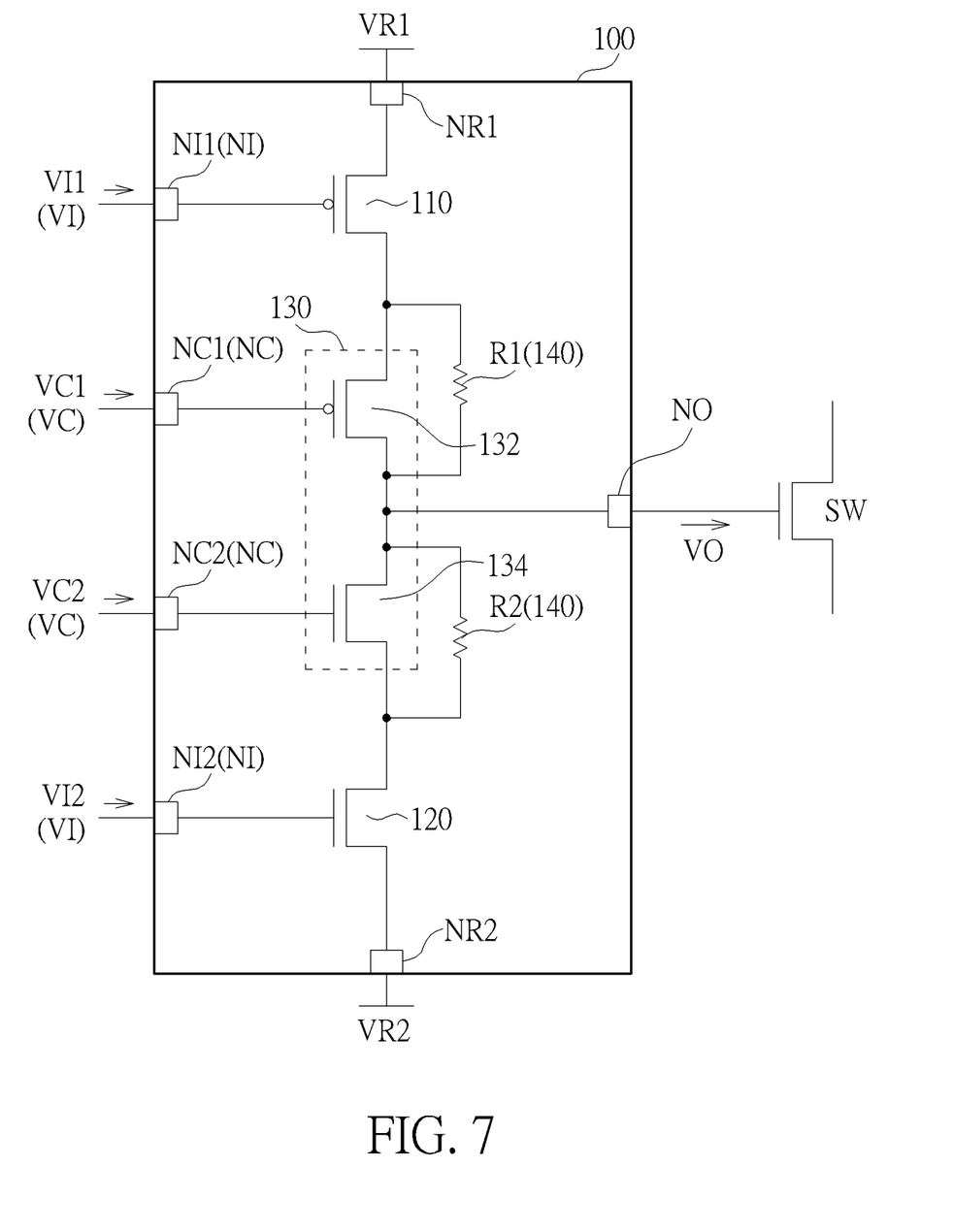
FIG. 7 illustrates the driving circuit of FIG. 1 coupled to the switch according to another embodiment.

FIG. 7 illustrates the driving circuit 100 of FIG. 1 coupled to the switch SW according to another embodiment. According to an embodiment, the driving circuit 100 can include a resistor module 140 coupled in parallel with the switch module 130. For example, as shown in FIG. 7, the resistor module 140 can include a first resistor R1 and a second resistor R2. The first resistor R1 can be coupled in parallel with the first switch 132, and the second resistor R2 can be coupled in parallel with the second switch 134. The first resistor R1 and the second resistor R2 can be used for voltage dividing, so as to avoid a floating signal of the output signal VO. Likewise, the driving circuit 100 of FIG. 3 can further comprise resistor(s) coupled in parallel with the first switch 132 and/or the second switch 134.

In FIG. 3, FIG. 5 and FIG. 7, the switch module 130 includes two switches as examples, and embodiments are not limited thereto. For example, one of the first switch 132 and the second switch 134 of the switch module 130 shown in FIG. 3, FIG. 5 and FIG. 7 can be to be omitted. For example, at least one of the first switch 132 and the second switch 134 can be a switch formed by a plurality of transistors coupled in a cascode structure.

Figure 8:
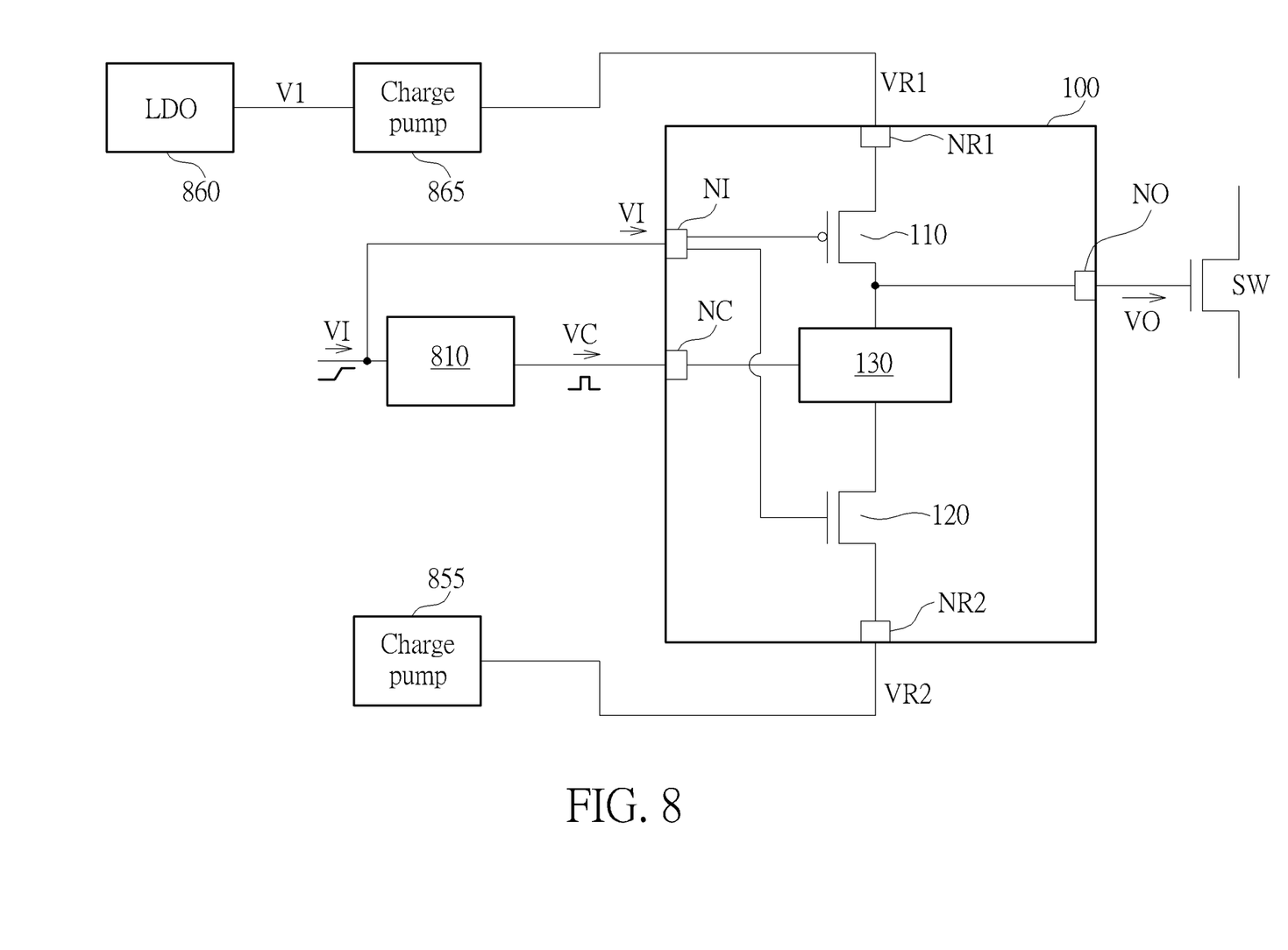
FIG. 8 illustrates the driving circuit of FIG. 1 coupled to the switch, a signal edge detector and a charge pump according to an embodiment.

FIG. 8 illustrates the driving circuit 100 of FIG. 1 coupled to the switch SW, a signal edge detector 810 and charge pumps 855 and 865 according to an embodiment. According to an embodiment, the turn-off period T2 of the switch module 130 can be determined by using a signal edge detector 810 to detect the at least one input signal VI. The signal edge detector 810 can detect the change of the logic levels of the at least one input signal VI, such as the change from the low level to the high level or from the high level to the low level. When the logic level of the input signal VI changes, the signal edge detector 810 can provide at least one control signal VC at a predetermined level to turn off the switch module 130. According to an embodiment, the signal edge detector 810 can include a pulse generator, and the pulse generator can include a resistor-capacitor (RC) delay circuit used to determine how long of the duration during which the switch module 130 be off, that is, the duration of the turn-off period T2. According to an embodiment, the signal edge detector 810 shown in FIG. 8 can be replaced by a clock detector, and in this condition, the turn-off period T2 of the switch module 130 can be determined by the clock detector.

According to an embodiment, at least one of the first reference voltage VR1 and the second reference voltage VR2 can be provided by a charge pump. As shown in FIG. 8, the second reference voltage VR2 can be a negative voltage provided by the charge pump 855. The low-dropout (LDO) regulator 860 can provide the voltage V1, and the charge pump 865 can convert the voltage V1 to generate and provide the first reference voltage VR1 for the driving circuit 100. For example, the first reference voltage VR1 can be higher than the voltage V1. FIG. 8 is an example, and embodiments are not limited thereto. By means of the switch module 130, the leakage path formed by the first transistor 110 and the second transistor 120 both in ON state can be avoided. Hence, at least one of the first reference voltage VR1 and the second reference voltage VR2 can be maintained relatively stable with a variation, for example, less than ±10%.

According to an embodiment, the turn-off period T2 of the switch module 130 and the transition period T1 of the at least one input signal VI can at least partially overlap, such that during the transition period T1, at least one of the first reference voltage VR1 and the second reference voltage VR2 may vary by less than 10%, for example, approximately 5%.

In summary, in the driving circuit 100, by turning off the switch module 130 during the transition period T1, the risk of condition, in which the first transistor 110 and the second transistor 120 are both in ON state and in which a conductive path is formed by the both ON transistors 110 and 120, can be reduced. As a result, the risk of instable voltage caused by the charge loss of the charge pump can also be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit, comprising:
   a first reference terminal configured to receive a first reference voltage;
   a second reference terminal configured to receive a second reference voltage;
   at least one input terminal configured to receive at least one input signal;
   an output terminal configured to output an output signal in response to the at least one input signal, wherein the output signal and the at least one input signal are at different logic levels;
   a first transistor coupled between the first reference terminal and the second reference terminal, and the first transistor comprising a control terminal coupled to the at least one input terminal;
   a second transistor coupled between the first transistor and the second reference terminal, and the second transistor comprising a control terminal coupled to the at least one input terminal;
   a switch module coupled between the first reference terminal and the first transistor, between the first transistor and the second transistor and/or between the second transistor and the second reference terminal, and the switch module comprising at least one control terminal; and
   at least one control signal terminal coupled to the at least one control terminal of the switch module, and the at least one control signal terminal configured to receive at least one control signal;
   wherein at least one level of the at least one input signal is switched during a transition period, and during the transition period of the at least one input signal, the switch module is maintained off during a turn-off period according to the at least one control signal, and during the turn-off period of the switch module, a leakage path through the first transistor and the second transistor is turned off;
   wherein the at least one level of the at least one input signal remains unchanged during a non-transition period, and during the non-transition period of the at least one input signal, the switch module is maintained on during a turn-on period according to the least one control signal;

wherein during the non-transition period, one of the first transistor and the second transistor is turned on, and the other one is turned off;

wherein the turn-off period of the switch module is determined according to the transition period of the at least one input signal, and the at least one input signal is received at the control terminal of the first transistor and the control terminal of the second transistor;

wherein the at least one input signal comprises a first input signal and a second input signal, the first input signal is transmitted to the control terminal of the first transistor, and the second input signal is transmitted to the control terminal of the second transistor;

wherein the at least one input terminal comprises a first input terminal configured to receive the first input signal, and a second input terminal configured to receive the second input signal; and wherein during the transition period, the first input signal is switched from a first level to a second level, and the second input signal is switched from a third level to a fourth level.

2. The driving circuit of claim 1, wherein one of the first transistor and the second transistor is turned on when another one is turned off.

3. The driving circuit of claim 1, wherein the first level is lower than the second level, and the third level is lower than the fourth level.

4. The driving circuit of claim 1, wherein the switch module further comprises:

a first switch coupled between the first transistor and the second transistor, and the first switch comprising a first control terminal coupled to a first control signal terminal of the at least one control signal terminal and the first control terminal configured to receive a first control signal of the at least one control signal; and a second switch coupled between the first switch and the second transistor, and the second switch comprising a second control terminal coupled to a second control signal terminal of the at least one control signal terminal and the second control terminal configured to receive a second control signal of the at least one control signal;

wherein the first switch is off for a first turn-off period according to the first control signal, the second switch is off for a second turn-off period according to the second control signal, and the turn-off period of the switch module is determined according to the first turn-off period and the second turn-off period.

5. The driving circuit of claim 4, wherein:
the first transistor and the first switch are of a first type;
the second transistor and the second switch are of a second type different from the first type; and
the first type is P-type or N-type.

6. The driving circuit of claim 4, wherein:
the first transistor and the first switch are P-type transistors;
the second transistor and the second switch are N-type transistors;
the first control signal is at a high level during the first turn-off period; and
the second control signal is at a low level during the second turn-off period.

7. The driving circuit of claim 4, further comprising:
a first resistor coupled in parallel with the first switch; and
a second resistor coupled in parallel with the second switch.

8. The driving circuit of claim 1,
wherein size of a first switch of the switch module is larger than or smaller than size of the first transistor, and size of a second switch of the switch module is larger than or smaller than size of the second transistor.

9. The driving circuit of claim 1, wherein:
one of the first transistor and the second transistor is P-type;
another one of the first transistor and the second transistor is N-type; and
the switch module comprises at least one transistor of P-type and/or N-type.

10. The driving circuit of claim 1, further comprising a resistor module coupled in parallel with the switch module.

11. The driving circuit of claim 1, wherein the turn-off period of the switch module is determined by using a signal edge detector to detect the at least one input signal.

12. The driving circuit of claim 11, wherein the signal edge detector detects change of logic levels of the at least one input signal.

13. The driving circuit of claim 11, wherein the signal edge detector comprises a pulse generator, and the pulse generator comprises a resistor-capacitor delay circuit configured to determine the duration of the turn-off period.

14. The driving circuit of claim 1, wherein the turn-off period of the switch module is determined by a clock detector.

15. The driving circuit of claim 1, wherein the duration of the transition period of the at least one input signal is approximately 1 microsecond, and the duration of the turn-off period of the switch module is approximately 0.7 to 1.2 microseconds.

16. The driving circuit of claim 1,
wherein the switch module comprises a transistor, and size of the transistor of the switch module is larger than size of the first transistor and size of the second transistor.

17. A driving circuit, comprising:
a first reference terminal configured to receive a first reference voltage;
a second reference terminal configured to receive a second reference voltage;
at least one input terminal configured to receive at least one input signal;
an output terminal configured to output an output signal in response to the at least one input signal, wherein the output signal and the at least one input signal are at different logic levels;
a first transistor coupled between the first reference terminal and the second reference terminal, and the first transistor comprising a control terminal coupled to the at least one input terminal;
a second transistor coupled between the first transistor and the second reference terminal, and the second transistor comprising a control terminal coupled to the at least one input terminal;
a switch module coupled between the first reference terminal and the first transistor, between the first transistor and the second transistor and/or between the second transistor and the second reference terminal, and the switch module comprising at least one control terminal; and at least one control signal terminal coupled to the at least one control terminal of the switch module, and the at least one control signal terminal configured to receive at least one control signal;

wherein at least one level of the at least one input signal is switched during a transition period, and during the transition period of the at least one input signal, the switch module is maintained off during a turn-off period according to the at least one control signal, and during the turn-off period of the switch module, a leakage path through the first transistor and the second transistor is turned off, and the turn-off period of the switch module and the transition period of the at least one input signal at least partially overlap;

wherein the at least one level of the at least one input signal remains unchanged during a non-transition period, and during the non-transition period of the at least one input signal, the switch module is maintained on during a turn-on period according to the least one control signal;

wherein during the transition period, one of the first transistor and the second transistor is turned on, and the other one is turned off;

wherein at least one of the first reference voltage and the second reference voltage is provided by a charge pump, and during the transition period, the at least one of the first reference voltage and the second reference voltage varies less than 10%; and wherein the turn-off period of the switch module is determined according to the transition period of the at least one input signal and the at least one input signal is received at the control terminal of the first transistor and the control terminal of the second transistor.

* * * * *